(12) United States Patent
Ren et al.

(10) Patent No.: US 11,398,344 B2
(45) Date of Patent: Jul. 26, 2022

(54) TRANSFORMER

(71) Applicant: Delta Electronics (Shanghai) CO., LTD, Shanghai (CN)

(72) Inventors: Liangliang Ren, Shanghai (CN); Shiwei Liu, Shanghai (CN); Hongbao Wang, Shanghai (CN); Dezhi Jiao, Shanghai (CN); Zengyi Lu, Shanghai (CN); Jinfa Zhang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 588 days.

(21) Appl. No.: 16/360,185

(22) Filed: Mar. 21, 2019

(65) Prior Publication Data

US 2019/0311846 A1 Oct. 10, 2019

(30) Foreign Application Priority Data

Apr. 9, 2018 (CN) .......................... 201820494712.7

(51) Int. Cl.
| | |
|---|---|
| *H01F 27/30* | (2006.01) |
| *H01F 27/32* | (2006.01) |
| *H05K 1/14* | (2006.01) |
| *H05K 1/18* | (2006.01) |
| *H01F 27/28* | (2006.01) |

(52) U.S. Cl.
CPC ....... *H01F 27/325* (2013.01); *H01F 27/2847* (2013.01); *H01F 27/306* (2013.01); *H05K 1/141* (2013.01); *H05K 1/18* (2013.01); *H05K 2201/1003* (2013.01)

(58) Field of Classification Search
USPC ......................................................... 336/198
See application file for complete search history.

(56) References Cited

U.S. PATENT DOCUMENTS

2006/0038650 A1    2/2006 Mehrotra et al.
2010/0026437 A1*   2/2010 Lin ..................... H01F 27/2847
                                              336/192

FOREIGN PATENT DOCUMENTS

CN              104103399 A      10/2014

\* cited by examiner

*Primary Examiner* — Ronald Hinson
(74) *Attorney, Agent, or Firm* — Qinghong Xu

(57) ABSTRACT

A transformer is disclosed, including a magnetic core, a bobbin, a primary winding wound around the bobbin, at least a first secondary winding and a second secondary winding and at least one turn of coil of the first secondary winding is adjacent to at least one turn of coil of the second secondary winding, and the first secondary winding and the second secondary winding are applied in a full-wave rectifier circuit. A leakage inductance groove is provided between a primary winding groove for winding the primary winding and a secondary winding groove for winding the secondary winding for isolating the primary winding and the secondary winding.

16 Claims, 17 Drawing Sheets

TRANSFORMER

CROSS REFERENCE

This application is based upon and claims priority to Chinese Patent Application No. 201820494712.7, filed on Apr. 9, 2018, the entire contents thereof are incorporated herein by reference.

TECHNICAL FIELD

The present disclosure relates to the technical field of power electronics, in particular to a transformer.

BACKGROUND

With the development of society, people's demand on energy is continuously increasing. High efficiency, high power density, high reliability and low cost have become the development trend. Improving power density, efficiency, and reliability of a power system has always been a major issue for R&D personnel. Increasing the switching frequency of a power supply is one approach, but the increase of the frequency will affect the switching loss of the power device. Therefore, increasing the frequency is not very effective for hard switching topology. In this sense, hard switching topology has seen its design bottleneck. At this time, soft switching topologies, such as LLC topology, are widely used. LLC (Resonant Circuit) is a single-port network containing inductors, capacitors, and resistive components. When phases of voltage and current waveforms of the port are the same at a certain operating frequency, a circuit resonance may occur. A LLC converter has been widely applied in industrial power supplies, server power supplies, communication power supplies, medical power supplies, and residential power supplies because of its soft switching characteristics within its full load range.

In order to further optimize the efficiency of the LLC converter and reduce the volume of the LLC converter, it is necessary to optimize the components of the LLC converter. A transformer is an important device in the LLC converter. In applications that output large currents, optimizing transformer losses is even more important. The structure of the transformer has a significant impact on the losses and needs to be optimized.

FIG. 1 shows a conventional LLC topology circuit. When outputting a low voltage, the secondary side is usually full-wave rectified. As shown in FIG. 1, the LLC converter includes an input capacitor $C_{in}$ and two power metal-oxide semiconductor field effect transistors (MOSFETs) Q1 and Q2; resonant capacitors $C_{s1}$, $C_{s2}$, a center tapped transformer Tx (including a primary winding Np and secondary windings $N_{s1}$, $N_{s2}$) in which the secondary windings have the same number of turns, an equivalent inductance Ls, full-wave rectified power transistors $Q_{R1}$ and $Q_{R2}$, and an output capacitance $C_o$. In high current output applications, the transformer usually has a structure of coils on a primary side and copper sheets on a secondary side. The structure of the conventional transformer is shown in FIG. 2. The transformer includes two secondary windings, and the two secondary windings are respectively disposed on both sides of the primary winding. When Fourier decomposition is performed on the currents of one of the secondary windings of the transformer, it may be found that the currents contain even order of harmonics. FIG. 3 shows a magnetic simulation result of the even order of harmonics of the windings. It can be seen from the figure that the magnetic fields generated by the even order of harmonics of the secondary windings will cut across the primary coil and generate eddy current in the primary coils, resulting in an increase in primary loss. FIG. 4 is a circuit diagram of a LLC topology in which the secondary windings of the transformer are connected in parallel (in which $N_{s11}$, $N_{s12}$, $N_{s21}$ and $N_{s22}$ denote the secondary windings of the transformer, and $Q_{R3}$ and $Q_{R4}$ denote full-wave rectified switches, and other reference numerals are the same as in FIG. 1). The conventional winding structure is shown in FIG. 5. This structure also leads to an increase in the primary loss of the transformer.

Therefore, a new structural solution of the transformer is needed.

The above information disclosed in the background section is only for facilitating understanding of the background of the present disclosure, and thus it may include information that does not constitute prior art known to those of ordinary skill in the art.

SUMMARY

The present disclosure provides a transformer that overcomes at least to some extent one or more of the problems due to limitations and disadvantages of the related art.

Other features and advantages of the present disclosure will be apparent from the following detailed description, or partly learned from practice of the present disclosure.

According to an exemplary embodiment of the present disclosure, there is provided a transformer, including: a magnetic core, a bobbin, a primary winding wound around the bobbin, at least a first secondary winding and a second secondary winding, wherein at least one turn of coil of the first secondary winding is adjacent to at least one turn of coil of the second secondary winding, the first secondary winding and the second secondary winding are applied in a full-wave rectifier circuit, and a leakage inductance groove is provided between a primary winding groove for winding the primary winding and a secondary winding groove for winding the secondary winding for isolating the primary winding and the secondary winding.

According to an exemplary embodiment of the present disclosure, the coil of the secondary winding is a copper sheet with a through hole that accommodates at least a portion of the bobbin and the magnetic core.

According to an exemplary embodiment of the present disclosure, the copper sheet is in an annular shape.

According to an exemplary embodiment of the present disclosure, different copper sheets in the same secondary winding are connected by a flying wire or a PCB.

According to an exemplary embodiment of the present disclosure, coils of the first secondary winding and coils of the second secondary winding are alternately arranged with each other.

According to an exemplary embodiment of the present disclosure, each of the first secondary winding and the second secondary winding includes at least two turns of coils respectively disposed on both sides of the primary winding.

According to an exemplary embodiment of the present disclosure, the primary winding includes at least two turns of coils on both sides of the first secondary winding and the second secondary winding, respectively.

According to an exemplary embodiment of the present disclosure, the number of turns of the coils of any one of the secondary windings is an odd number.

According to an exemplary embodiment of the present disclosure, a surface of the bobbin has a copper tab for fixing the copper sheets.

According to an exemplary embodiment of the present disclosure, a bottom corner of the copper sheet is bent.

According to an exemplary embodiment of the present disclosure, the leakage inductance generated from the leakage inductance groove functions as a resonant inductance.

According to an exemplary embodiment of the present disclosure, the transformer further includes a third secondary winding and a fourth secondary winding, wherein the third secondary winding and the first secondary winding are connected in parallel via at least two switching diodes or MOSFETs, and the fourth secondary winding and the second secondary winding are connected in parallel via at least two switching diodes or MOSFETs.

According to an exemplary embodiment of the present disclosure, the transformer further includes a third secondary winding and a fourth secondary winding, wherein the third secondary winding and the first secondary winding are connected in parallel, and the fourth secondary winding and the second secondary winding are connected in parallel.

According to an exemplary embodiment of the present disclosure, the transformer is applied in an LLC circuit.

According to an exemplary embodiment of the present disclosure, the transformer is applied in a phase shifted full bridge circuit or a half bridge circuit.

According to some embodiments of the present disclosure, by winding the secondary windings of the transformer, the magnetic fields generated by the even order of harmonics of the two windings of the secondary side can be cancelled, thereby reducing the copper loss caused by the even order magnetic field harmonics.

According to other embodiments of the present disclosure, in order to reduce the number of magnetic components, the primary and secondary sides are separated by providing a groove between the primary and secondary windings, and the leakage inductance is utilized as the resonant inductance of the converter.

According to still another embodiment of the present disclosure, the primary winding of the transformer is on the two sides, and the copper sheets of the two secondary windings are alternately disposed in the middle of the transformer, so that the magnetic fields generated by the even order of harmonics of the secondary windings can also be canceled out, so that the primary winding will not be cut across, thereby reducing copper loss.

It should be understood that both the foregoing general description and the following detailed description are exemplary and explanatory only and are not restrictive of the disclosure.

BRIEF DESCRIPTION OF THE DRAWINGS

The above and other objectives, features and advantages of the present disclosure will become more apparent from exemplary embodiments described in detail with reference to the accompanying drawings.

DETAILED DESCRIPTION

Figure 1:
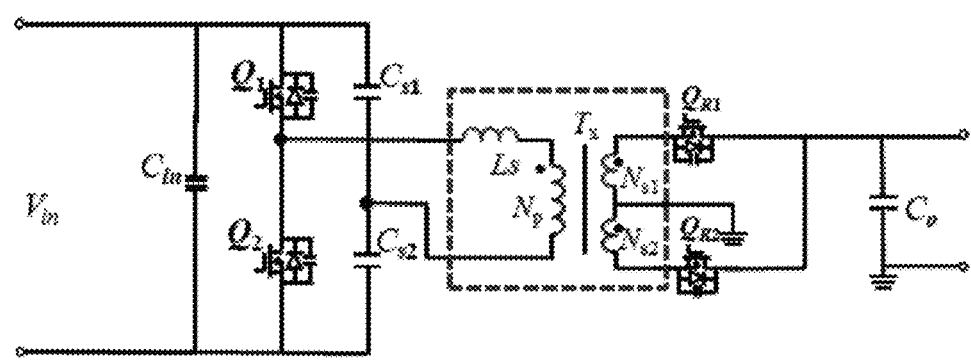
FIG. 1 shows a circuit diagram of a conventional LLC topology.
Figure 2:
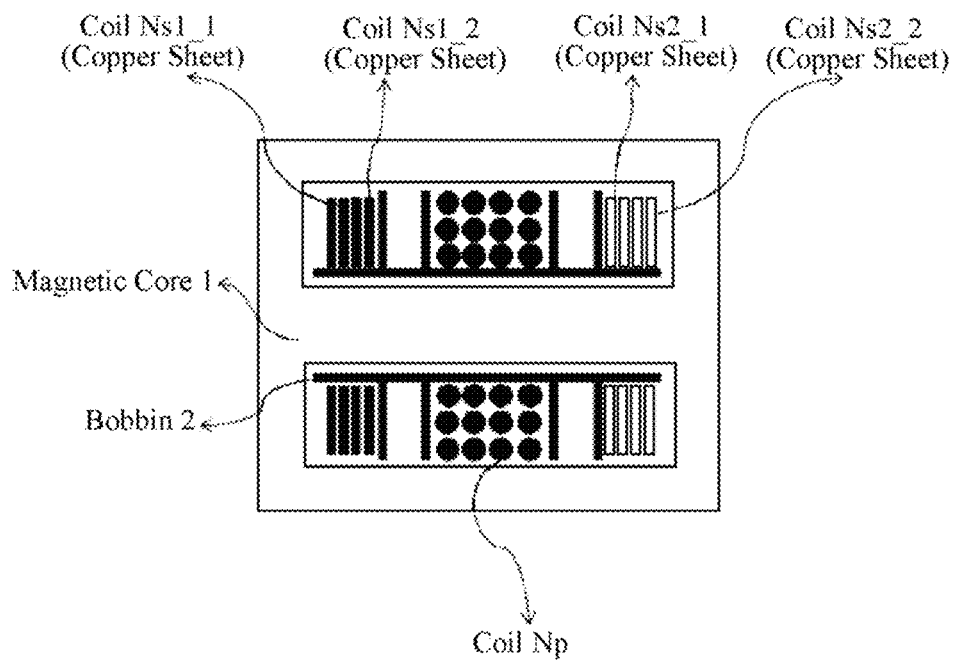
FIG. 2 shows a schematic diagram of a conventional transformer structure.
Figure 3:
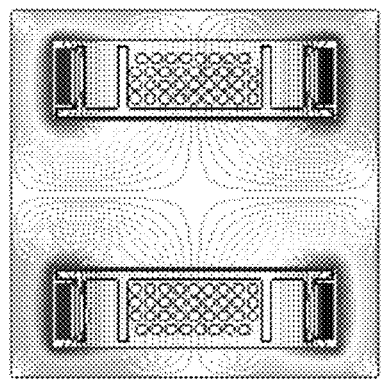
FIG. 3 is a schematic diagram showing a magnetic simulation result of even order of harmonics of the secondary windings in the conventional transformer structure shown in FIG. 2.
Figure 4:
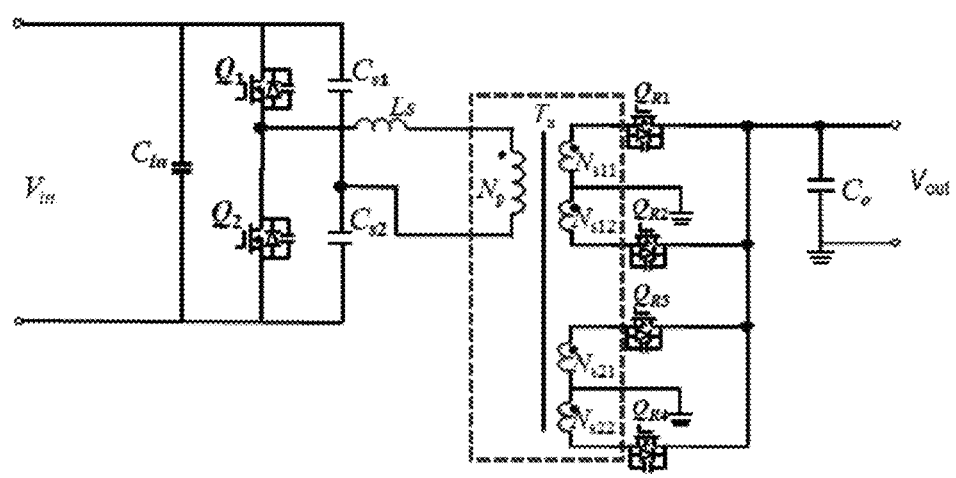
FIG. 4 is a circuit diagram showing an LLC topology in which the secondary windings of the transformer are in a parallel configuration.
Figure 5:
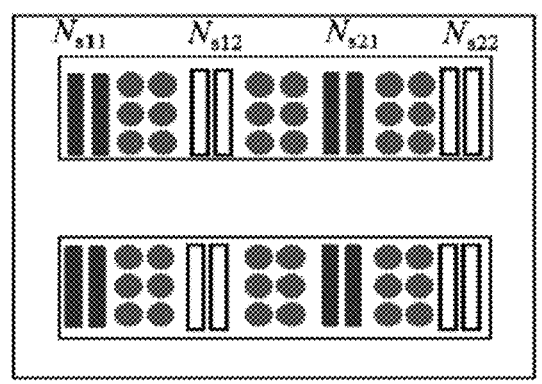
FIG. 5 shows a schematic diagram of a transformer in which the secondary windings are in a parallel configuration.

Exemplary embodiments will now be described more fully with reference to the accompanying drawings. However, the exemplary embodiments can be embodied in a variety of forms and should not be construed as being limited to the examples set forth herein. Rather, these embodiments are provided so that the present disclosure will be thorough and complete, and to fully convey the concept of the exemplary embodiments to those skilled in the art. The same reference numerals in the drawings denote the same or similar parts, and the repeated description thereof will be omitted.

In addition, the described features, structures, or characteristics may be combined in any suitable manner in one or more embodiments. In the following description, numerous specific details are set forth to facilitate thorough understanding of the embodiments of the present disclosure. However, one skilled in the art will appreciate that one or more of the specific details may be omitted or other methods, components, devices, steps, etc. may be implemented. In other instances, technical solutions well known in the art will not be illustrated or described in detail, to avoid obscuring the various aspects of the present disclosure.

It will be understood that, although the terms first, second, third, etc. may be used herein to describe various components, these components are not limited by these terms. These terms are used to distinguish one component from another. Thus, a first component discussed below could be termed a second component without departing from the teachings of the present disclosure. The term "and/or" as used herein includes any and all combinations of one or more of the associated listed items.

One skilled in the art will appreciate that the drawings are only schematic diagrams of exemplary embodiments, and the modules or processes in the drawings are not necessarily required to implement the present disclosure, and therefore cannot be used to limit the scope of protection of the present disclosure.

An objective of the present disclosure is to provide a transformer. The transformer includes a magnetic core, a bobbin, a primary winding wound around the bobbin, and at least a first secondary winding and a second secondary winding. At least one turn of coil of the first secondary winding is adjacent to at least one turn of coil of the second secondary winding. The first secondary winding and the second secondary winding are applied in a full-wave rectifier circuit. In the bobbin, a leakage inductance groove is provided between a primary winding groove for winding the primary winding and a secondary winding groove for winding the secondary winding. The leakage inductance groove is used for isolating the primary winding and the secondary winding. In one embodiment, the secondary windings of the transformer are arranged alternately to cancel the magnetic fields generated by the even order of harmonics of the two windings of the secondary side, thereby reducing the copper loss caused by the even order magnetic field harmonics. In another embodiment, in order to reduce the number of magnetic components, a groove is provided between the primary and secondary windings to separate the primary and secondary sides, and a leakage inductance is taken as the resonant inductance of the converter. In yet another embodiment, the primary winding of the transformer are disposed on both sides, and copper sheets of two secondary windings are disposed alternately in the middle of the transformer. In this way, the magnetic fields generated by the even order of harmonics of the secondary windings can also be offset, so that the primary winding will not be cut across and the copper loss can be reduced.

Figure 6:
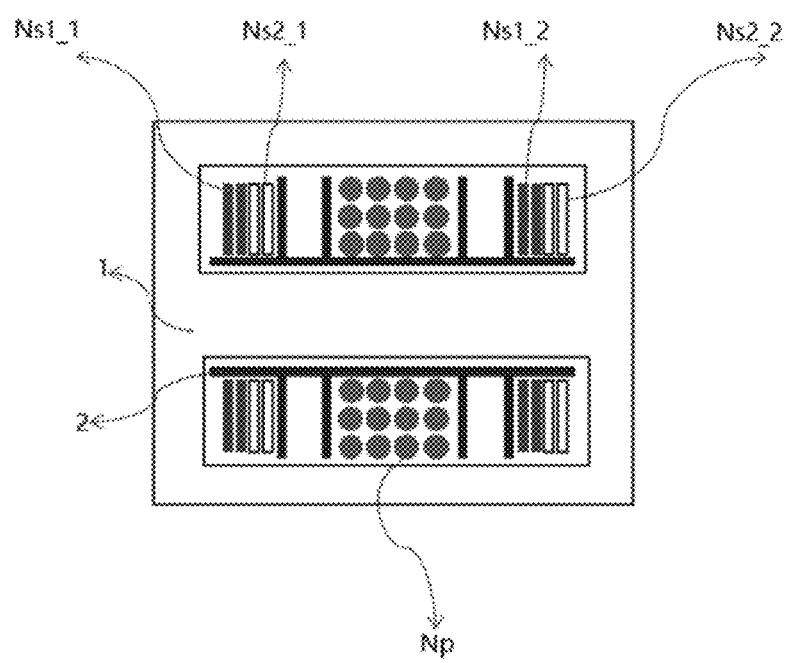
FIG. 6 shows a schematic diagram of a transformer according to an exemplary embodiment of the present disclosure.
Figure 7:
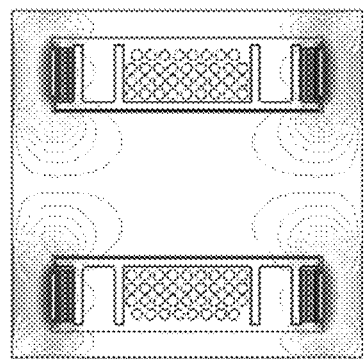
FIG. 7 is a diagram showing distribution of magnetic fields of even order of harmonics of the secondary windings in the transformer shown in FIG. 6.
Figure 8:
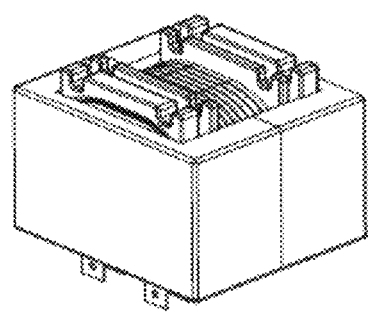
FIG. 8 shows an assembled view of a transformer according to an exemplary embodiment of the present disclosure.
Figure 9:
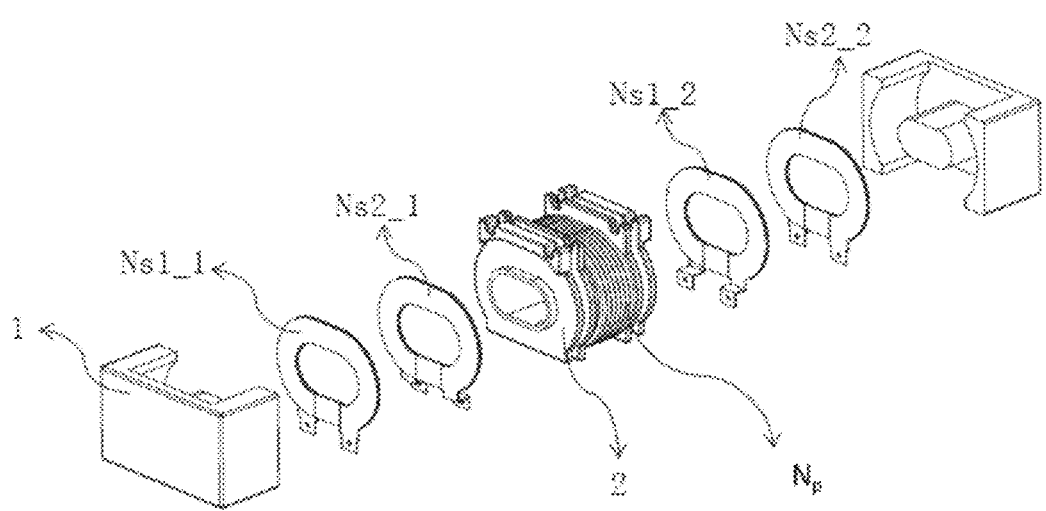
FIG. 9 shows an exploded view of a transformer according to an exemplary embodiment of the present disclosure.
Figure 10:
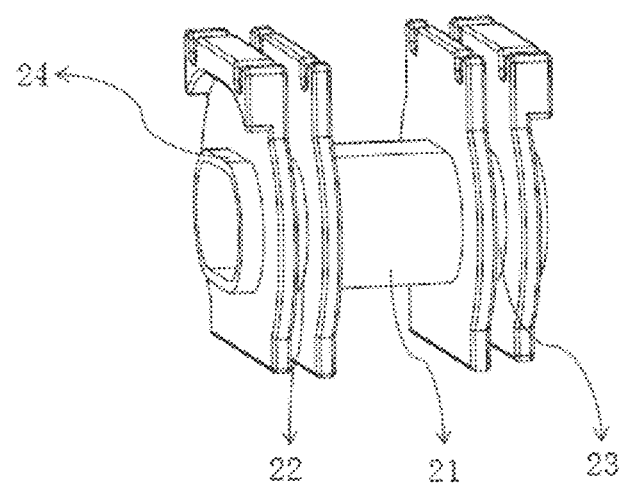
FIG. 10 illustrates a structural diagram of a winding bobbin of a transformer according to an exemplary embodiment of the present disclosure.
Figure 11:
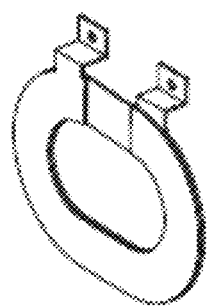
FIG. 11 shows a diagram of a copper sheet on a secondary side of a transformer according to an exemplary embodiment of the present disclosure.
Figure 12:
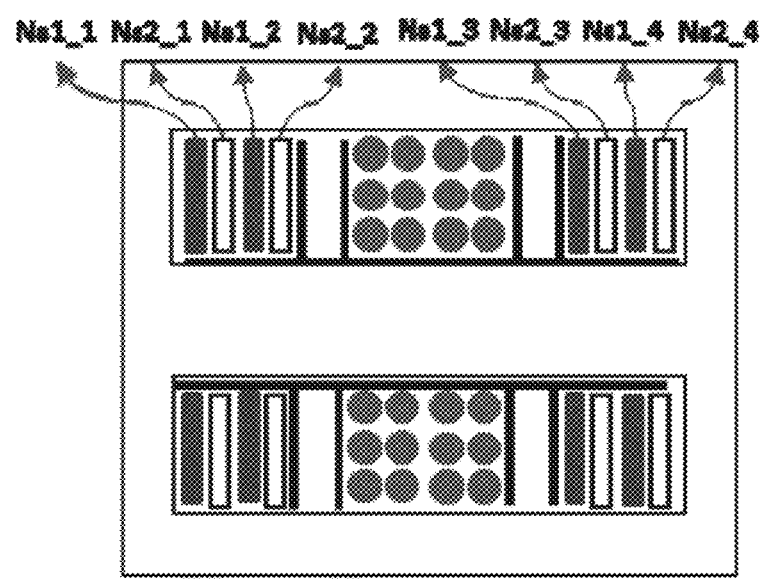
FIG. 12 illustrates a schematic diagram of a transformer in which two secondary windings are alternating by each turn, according to an exemplary embodiment of the present disclosure.
Figure 13:
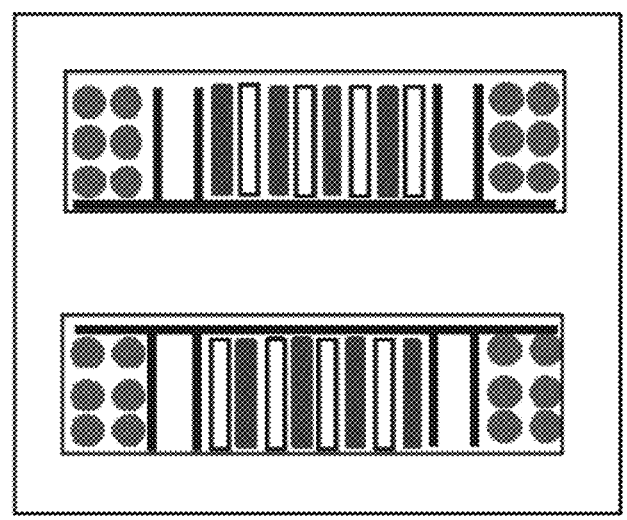
FIG. 13 illustrates a schematic diagram of a transformer in which two secondary windings are alternating by each turn, the secondary side is in the middle and the primary side is on two sides, according to an exemplary embodiment of the present disclosure.
Figure 14:
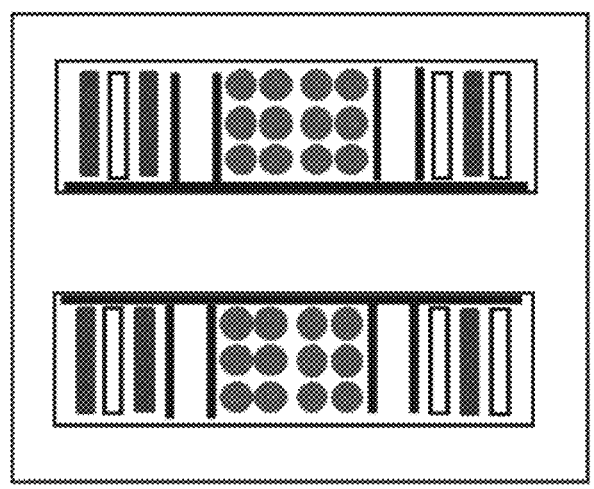
FIG. 14 illustrates a schematic diagram of a transformer in which secondary windings have an odd number of turns and are arranged alternatingly, according to an exemplary embodiment of the present disclosure.
Figure 15:
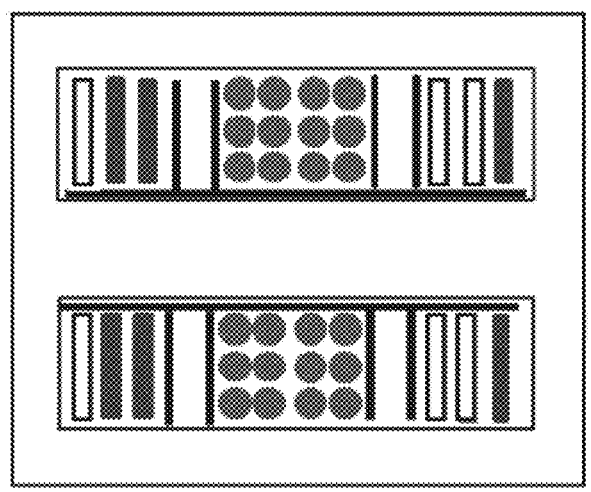
FIG. 15 illustrates a schematic diagram of a transformer in which secondary windings have an odd number of turns and are arranged alternatingly, according to another exemplary embodiment of the present disclosure.
Figure 16:
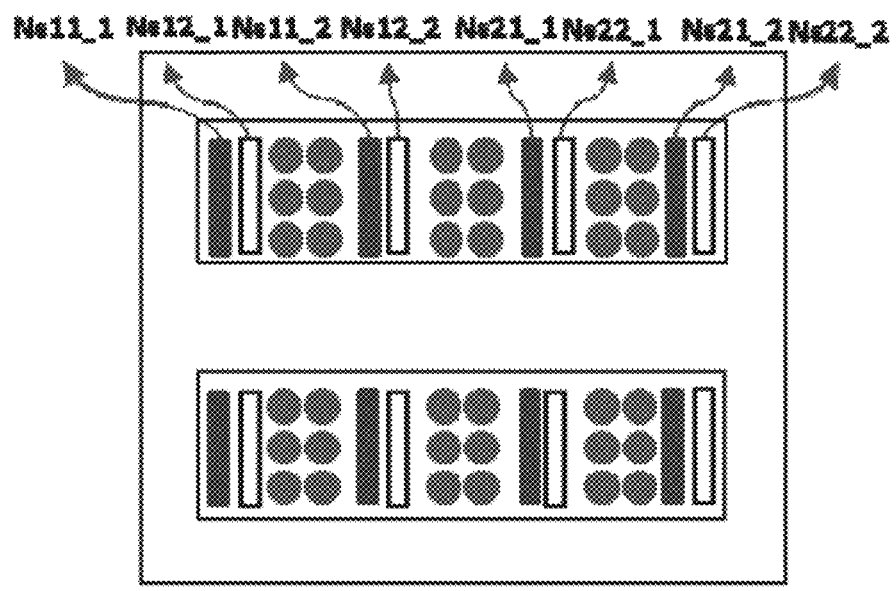
FIG. 16 is a schematic diagram of a transformer in which two secondary windings are connected in parallel and the secondary windings are arranged alternately according to an exemplary embodiment of the present disclosure.
Figure 17:
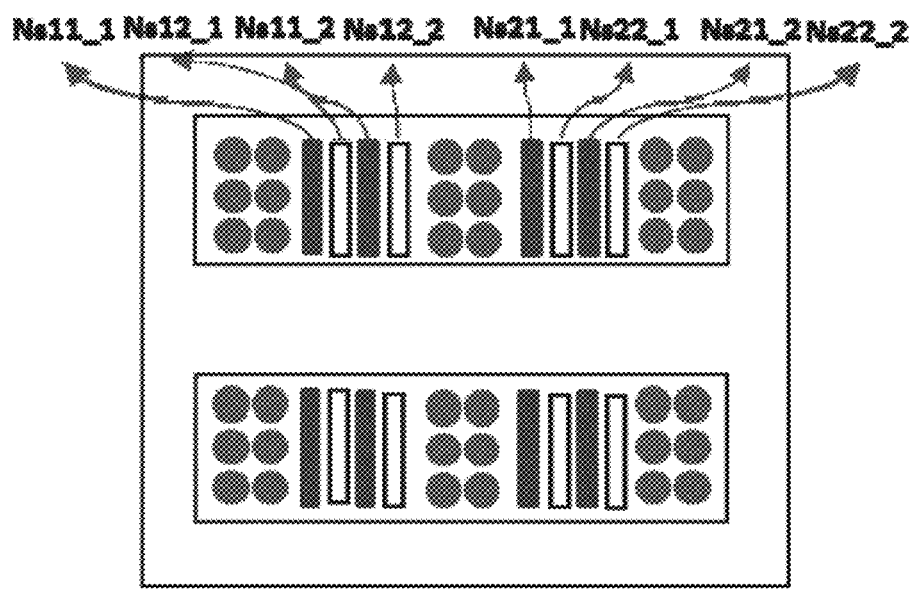
FIG. 17 is a schematic diagram of a transformer in which two secondary windings are connected in parallel and the secondary windings are arranged alternately according to another exemplary embodiment of the present disclosure.

The transformer of the present disclosure will be described in detail below with reference to FIGS. 6-17. FIG. 6 shows a schematic diagram of a transformer according to an exemplary embodiment of the present disclosure. FIG. 7 is a diagram showing distribution of magnetic fields of even order of harmonics of the secondary windings in the transformer shown in FIG. 6. FIG. 8 shows an assembled view of a transformer according to an exemplary embodiment of the present disclosure. FIG. 9 shows an exploded view of a transformer according to an exemplary embodiment of the present disclosure. FIG. 10 illustrates a structural diagram of a winding bobbin of a transformer according to an exemplary embodiment of the present disclosure. FIG. 11 shows a diagram of a copper sheet on a secondary side of a transformer according to an exemplary embodiment of the present disclosure. FIG. 12 illustrates a schematic diagram of a transformer in which two secondary windings are alternating by each turn, according to an exemplary embodiment of the present disclosure. FIG. 13 illustrates a schematic diagram of a transformer in which two secondary windings are alternating by each turn, the secondary side is in the middle and the primary side is on two sides, according to an exemplary embodiment of the present disclosure. FIG. 14 illustrates a schematic diagram of a transformer in which secondary windings have an odd number of turns and are arranged alternatingly, according to an exemplary embodiment of the present disclosure. FIG. 15 illustrates a schematic diagram of a transformer in which secondary windings have an odd number of turns and are arranged alternatingly, according to another exemplary embodiment of the present disclosure. FIG. 16 is a schematic diagram of a transformer in which two secondary windings are connected in parallel and the secondary windings are arranged alternately according to an exemplary embodiment of the present disclosure. FIG. 17 is a schematic diagram of a transformer in which two secondary windings are connected in parallel and the secondary windings are arranged alternately according to another exemplary embodiment of the present disclosure.

It should be particularly noted that the exemplary embodiment of the present disclosure describes a transformer of the present disclosure by using a transformer as an example of an LLC circuit, but the present disclosure is not limited thereto, and the transformer of the present disclosure can also be applied in phase shift full bridge circuits or half bridge circuits and can achieve similar technical effects Firstly, a transformer according to an exemplary embodiment of the present disclosure will be described in details with reference to FIG. 6-11. FIG. 6 shows a schematic diagram of a transformer according to an exemplary embodiment of the present disclosure. FIG. 7 is a diagram showing distribution of magnetic fields of even order of harmonics of the secondary windings in the transformer shown in FIG. 6. FIG. 8 shows an assembled view of a transformer according to an exemplary embodiment of the present disclosure. FIG. 9 shows an exploded view of a transformer according to an exemplary embodiment of the present disclosure. FIG. 10 illustrates a structural diagram of a winding bobbin of a transformer according to an exemplary embodiment of the present disclosure. FIG. 11 shows a diagram of a copper sheet on a secondary side of a transformer according to an exemplary embodiment of the present disclosure.

As shown FIGS. 6, 8 and 9, the transformer includes a magnetic core 1, a bobbin 2, a primary winding Np wound around the bobbin, and at least a first secondary winding Ns1 and a second secondary winding Ns2. At least one turn of coil of the first secondary winding is adjacent to at least one turn of coil of the second secondary winding (for example, one turn of coil Ns1_1 of the first secondary winding Ns1 is adjacent to one turn of coil Ns2_1 of the second secondary winding Ns2, and another turn of coil Ns1_2 of the first secondary winding Ns1 is adjacent to another turn of coil Ns2_2 of the second secondary winding Ns2). The first secondary winding and the second secondary winding are applied in a full-wave rectifier circuit. The structure of the bobbin 2 is as shown in FIG. 10, in which each of the leakage inductance grooves 22, 23 is provided between a primary winding groove 21 for winding the primary winding Np and a secondary winding groove for winding the secondary winding for isolating the primary winding and the secondary winding. The transformer of the present disclosure can eliminate the magnetic fields generated by the even order of harmonics of the two windings of the secondary side by winding the secondary windings of the transformer alternately, thereby reducing the copper loss caused by the even order magnetic field harmonics. In addition, in order to reduce the number of magnetic components, a groove is provided between the primary and secondary windings to separate the primary and secondary sides, and the leakage inductance is taken as the resonant inductance of the converter.

Specifically, FIG. 6 is an embodiment of the transformer structure provided by the present disclosure. The number of turns of the secondary side is 4, and full-wave rectification is adopted. The secondary windings Ns1_1 and Ns2_1 of the transformer are disposed on the left side of the primary winding alternately, and the secondary windings Ns1_2 and Ns2_2 of the transformer are disposed on the right side of the primary winding alternately. The magnetic fields generated by the two windings on the secondary side can offset each other. The magnetic field simulation is shown in FIG. 7. It can be seen that the magnetic fields generated by the even order of harmonics of the secondary windings will not cut across the primary coils, which can reduce the eddy current loss of the primary coils, thereby reducing the original copper loss.

FIG. 8 shows an embodiment of the overall structure assembly diagram of the transformer provided by the present disclosure, and FIG. 9 is an exploded view of the transformer structure, which includes a bobbin, a pair of magnetic cores, and two secondary copper sheet coils arranged alternately, and a primary coil. FIG. 10 illustrates a detailed diagram of a winding bobbin of the transformer. Two grooves are provided between the primary coil and the secondary copper sheet to separate the primary and secondary sides, thereby increasing the leakage inductance between the primary and secondary sides. The leakage inductance is taken as the resonant inductance, which can reduce the number of magnetic components. In one embodiment, the coil of the secondary winding is a copper sheet with a through hole for accommodating at least a part of the bobbin and the magnetic core. FIG. 11 is a copper structure diagram of the secondary winding of the transformer, in which the copper sheet is in an annular shape. Since two pieces of copper sheets are stacked together, the bottom corner of one of the copper sheets is bent. In another embodiment, different copper sheets in the same secondary winding are connected by flying leads or PCBs.

According to an exemplary embodiment of the present disclosure, the surface of the bobbin 2 has a copper tab 24 for fixing the copper sheets, as shown in FIG. 10.

According to an exemplary embodiment of the present disclosure, the coils of the first secondary winding and the coils of the second secondary winding are disposed alternately to each other. That is, as shown in FIG. 12, the two windings of the secondary side are alternating by each turn. That is, on one side of the primary winding, the first turn of coil Ns1_1 of the first secondary winding Ns1, the first turn of coil Ns2_1 of the second secondary winding Ns2, the second turn of coil Ns1_2 of the first secondary winding Ns1, and the second turn of coil Ns2_2 of the second secondary winding Ns2 are sequentially arranged in this order. While on the other side of the primary winding, the third turn of coil Ns1_3 of the first secondary winding Ns1, the third turn of coil Ns2_3 of the second secondary winding Ns2, the fourth turn of coil Ns1_4 of the first secondary winding Ns1, and the fourth turn of coil Ns2_4 of the second secondary winding Ns2 are sequentially arranged in this order. In this way, the magnetic fields generated by the even order of harmonics of the secondary windings can be offset better, and the loss can be reduced.

According to an exemplary embodiment of the present disclosure, the first secondary winding and the second secondary winding include at least two turns of coils respectively disposed on both sides of the primary winding.

According to an exemplary embodiment of the present disclosure as shown in FIG. 13, the primary winding includes at least two turns of coils respectively on both sides of the first secondary winding and the second secondary winding. That is to say, the primary winding of the transformer is on the two sides, and the copper sheet windings of the two secondary windings are disposed in the middle of the transformer alternately, so that the magnetic fields generated by the even order of harmonics of the secondary windings can also be offset, so that the primary winding will not be cut across, and the copper loss can be reduced.

According to some example embodiments of the present disclosure, the number of turns of the coils of any of the secondary windings is an odd number. FIG. 14 shows an embodiment of a transformer structure in which the secondary winding has an odd number of turns, and the two windings of the secondary side are arranged alternately. Since it is an odd number, the magnetic fields generated by the even order of harmonics of the windings of the secondary side cannot be offset completely, but most of the magnetic fields can be, thereby reducing the copper loss of the transformer. FIG. 15 shows another embodiment of the transformer structure in which the secondary winding has an odd number of turns, the left windings Ns1 and Ns2 are respectively arranged in two turns and one turn, and the right windings Ns1 and Ns2 are respectively arranged in one turn and two turns. It can have a similar effect to that of the embodiment of FIG. 14.

According to an exemplary embodiment of the present disclosure, the transformer further includes a third secondary winding and a fourth secondary winding. The third secondary winding and the first secondary winding are connected in parallel via at least two diodes or MOSFETs, and the fourth secondary winding and the second secondary winding are connected in parallel via at least two diodes or MOSFETs.

According to some example embodiments of the present disclosure, the transformer further includes a third secondary winding and a fourth secondary winding. The third secondary winding and the first secondary winding are connected in parallel, and the fourth secondary winding and the second secondary winding are connected in parallel. FIG. 16 shows an embodiment of a transformer in which the secondary windings are connected in parallel according to the present disclosure (in which the first to fourth secondary windings are respectively represented by Ns11, Ns12, Ns21 and Ns22, and the first and second turns of the first secondary winding Ns11 are respectively represented by Ns11_1 and Ns11_2, and so on so forth). Part of the first and second secondary windings Ns11 and Ns12 are arranged alternately, and part of the third and fourth secondary windings Ns21 and Ns22 are arranged alternately. In this way, the magnetic fields generated by the even order of harmonics of the secondary side can be offset by each other, thereby reducing the copper loss. FIG. 17 shows another embodiment of a transformer structure in which the secondary windings are connected in parallel according to the present disclosure. The first and second secondary windings Ns11 and Ns12 are all arranged alternately, and the third and fourth secondary windings Ns21 and Ns22 are all arranged alternately. It can achieve the same effect of reducing transformer loss.

From the above detailed description, those skilled in the art will readily appreciate that a transformer according to an embodiment of the present disclosure has one or more of the following advantages.

According to some embodiments of the present disclosure, by winding the secondary windings of the transformer, the magnetic fields generated by the even order of harmonics of the two secondary windings can be offset, thereby reducing the copper loss caused by the even order magnetic field harmonics.

According to other embodiments of the present disclosure, in order to reduce the number of magnetic components, the primary and secondary sides are separated by providing a groove between the primary and secondary windings, and the leakage inductance is utilized as the resonant inductance of the converter.

According to still another embodiment of the present disclosure, the primary winding of the transformer is on the two sides, and the copper sheets of the two secondary windings are alternately disposed in the middle of the transformer, so that the magnetic fields generated by the even order of harmonics of the secondary windings can also be offset, so that the primary winding will not be cut across, thereby reducing copper loss.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A center tapped transformer, comprising:
   a magnetic core;
   a bobbin;
   a primary winding wound around the bobbin;
   a first secondary winding, comprising a first turn of coil and a second turn of coil; and
   a second secondary winding, comprising a third turn of coil and a fourth turn of coil,
   wherein the first secondary winding and the second secondary winding are applied in a full-wave rectifier circuit, for outputting voltage to full-wave rectified power transistors; the first turn of coil is adjacent to the third turn of coil and the second turn of coil is adjacent to the fourth turn of coil, for eliminating magnetic fields generated by even orders of harmonics of the first secondary winding and the second secondary winding; and a leakage inductance groove is provided between a primary winding groove for winding the primary winding and a secondary winding groove for winding the secondary winding, the leakage inductance groove isolating the primary winding and the secondary winding.

2. The transformer according to claim 1, wherein the number of turns of the coils of any one of the secondary windings is odd.

3. The transformer of claim 1, wherein a leakage inductance generated the leakage inductance groove functions as a resonant inductance.

4. The transformer according to claim 1, further comprising a third secondary winding and a fourth secondary winding, wherein the third secondary winding and the first secondary winding are connected in parallel via at least two diodes or MOSFETs, and the fourth secondary winding and the second secondary winding are connected in parallel via at least two diodes or MOSFETs.

5. The transformer according to claim 1, further comprising a third secondary winding and a fourth secondary winding, wherein the third secondary winding and the first secondary winding are connected in parallel, and the fourth secondary winding and the second secondary winding are connected in parallel.

6. The transformer according to claim 1, wherein the transformer is applied in an LLC circuit.

7. The transformer according to claim 1, wherein the transformer is applied in a phase shifted full bridge circuit or a half bridge circuit.

8. The transformer according to claim 1, wherein the coil of the secondary winding is a copper sheet with a through hole that accommodates at least a portion of the bobbin and the magnetic core.

9. The transformer according to claim 8, wherein the copper sheet is in an annular shape.

10. The transformer according to claim 8, wherein different copper sheets in the same secondary winding are connected by a flying wire or a PCB.

11. The transformer according to claim 8, wherein a part of surface of the bobbin is flat for fixing the copper sheet.

12. The transformer of claim 8, wherein the copper sheet has bent bottom corners.

13. The transformer according to claim 1, wherein the first turn of coil and the third turn of coil are disposed on one side of the primary winding, and the second turn of coil and the fourth turn of coil are disposed on the other side of the primary winding.

14. The transformer according to claim 13, wherein the number of turns of the coils of any one of the secondary windings is odd.

15. The transformer according to claim 1, wherein the primary winding comprises at least two turns of coils on both sides of the first secondary winding and the second secondary winding, respectively.

16. The transformer according to claim 15, wherein the number of turns of the coils of any one of the secondary windings is odd.

* * * * *